United States Patent
Hariharan et al.

(10) Patent No.: US 7,355,404 B1
(45) Date of Patent: Apr. 8, 2008

(54) SYSTEM AND METHOD OF SAR MANAGEMENT FOR AN MR SCAN

(75) Inventors: Hari Hariharan, Pewaukee, WI (US); Joseph D. Schaefer, Waukesha, WI (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 11/275,128

(22) Filed: Dec. 13, 2005

(51) Int. Cl.
*G01V 3/00* (2006.01)
(52) U.S. Cl. .................................... 324/307
(58) Field of Classification Search ......... 324/300–322
See application file for complete search history.

(56) References Cited
U.S. PATENT DOCUMENTS

| | | | |
|---|---|---|---|
| 6,759,847 B2 * | 7/2004 | Brinker et al. .............. | 324/309 |
| 6,762,605 B2 * | 7/2004 | Brinker et al. .............. | 324/309 |
| 6,812,698 B1 * | 11/2004 | Tsukamoto ................. | 324/309 |
| 6,841,999 B2 * | 1/2005 | Arneth et al. ............... | 324/309 |
| 7,046,003 B2 * | 5/2006 | Hargreaves et al. ........ | 324/307 |
| 7,187,172 B2 * | 3/2007 | Bielmeier et al. .......... | 324/314 |

FOREIGN PATENT DOCUMENTS

JP      8-38447      *  2/1996

* cited by examiner

*Primary Examiner*—Brij Shrivastav
*Assistant Examiner*—Dixomara Vargas
(74) *Attorney, Agent, or Firm*—Ziolkowski Patent Solutions Group, SC

(57) ABSTRACT

A method and apparatus for RF deposition prediction model refinement measures an RF parameter during a scan and refines the RF deposition prediction model by a correction factor based on the measured RF parameter.

21 Claims, 2 Drawing Sheets

SYSTEM AND METHOD OF SAR MANAGEMENT FOR AN MR SCAN

BACKGROUND OF THE INVENTION

The present invention relates generally to magnetic resonance (MR) imaging and, more particularly, to a process for updating a specific absorption rate (SAR) prediction model for data acquisition of a given subject based on determined SAR characteristics of the given subject.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$, which is realized by an RF pulse, is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

High field MR scanners, for example, 3T and above, are designed to continuously monitor RF energy deposited in a subject. In particular, the RF energy absorbed per unit of mass of the subject, or SAR, is monitored during a scan. When measured SAR reaches a prescribed limit, scanning is interrupted. To assist prescription of the scan to avoid an SAR tripping level, an RF prediction model is generally used to guide the user in setting sequence parameter limits such that the prescribed scan has a high probability for completion without exceeding RF limits. This model is typically based on RF energy measurements collected or modeled from a set of volunteers or phantoms and is generally tied to the weight of the subject. RF absorption equivalent mass (SAR mass) is assumed to be the weight of the subject. Two parameters that are optimized in the model include scan time for required number of slices and the probability of the scan completing without causing an RF limit trip or interruption.

Generally, the weight of the patient is a good approximation of the SAR mass. However, it is possible for the SAR mass of the given patient to be inaccurate. For example, a more muscular patient would have more SAR mass than a less muscular patient for the same weight. This SAR mass translates into a higher RF threshold for the patient relative to the predicted RF threshold. Conversely, if the patient SAR mass predicted is greater than the actual SAR mass of the patient, the prediction model may guide prescription to a scan protocol with excessive SAR for the patient.

Power monitors are used during the scan to interrupt the scan if measured SAR becomes excessive. The combination of the prediction model and the use of power monitors helps to ensure that patient mass errors do not compromise SAR limits. However, if the SAR mass of the patient is inaccurately predicted, the power monitor may unnecessarily trip based on a poorly calculated scan. On the other hand, the prediction model may over-estimate RF deposition in the patient and result in an under-powered scan.

It would therefore be desirable to have a system and method capable of allowing for refinement of the RF prediction model that is insensitive to patient particulars.

BRIEF DESCRIPTION OF THE INVENTION

The present invention provides a system and method of updating an RF prediction model that overcomes the aforementioned drawbacks. In this regard, the present invention includes an RF prediction model refinement technique whereby the RF prediction model is modified by a correction factor based on an RF parameter measured during execution of a scan.

Therefore, in accordance with one aspect of the invention, the present invention includes a method of MR imaging that includes the steps of determining a radio frequency (RF) deposition prediction model for a scan and guiding prescription of the scan with the RF deposition prediction model. The method further includes the steps of measuring an RF parameter value during execution of the scan and determining a correction factor based on the measured RF parameter value. The method further includes the step of updating the RF deposition prediction model by the correction factor.

In accordance with another aspect of the invention, an MR imaging apparatus has a plurality of gradient coils positioned about a bore of a magnet to impress a polarizing magnetic field and an RF transceiver system and an RF switch controlled by a pulse module to transmit RF signals to an RF coil assembly to acquire MR images. The apparatus further includes a computer readable storage medium having stored thereon a computer program comprising instructions which when executed by a computer cause the computer to establish a radio frequency (RF) deposition prediction model for a scan, the model setting sequence parameter limits for the scan. The computer is also programmed to guide prescription of the scan within the sequence parameter limits. The computer is further programmed to predict a value for a measurable RF parameter based on the prescribed scan, perform the prescribed scan, and measure the measurable RF parameter during the scan to determine a measured value. The computer is also programmed to compare the predicted value to the measured value and update the RF deposition prediction model based on the comparison.

According to another aspect, the invention is embodied in a computer program stored on a computer readable storage medium having instructions that when executed by a computer cause the computer to establish a specific absorption rate (SAR) prediction model for a scan and perform the scan to acquire MR data from a subject. The computer is also caused to measure at least one RF parameter level during the scan and update the SAR prediction model for a subsequent scan of the subject.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
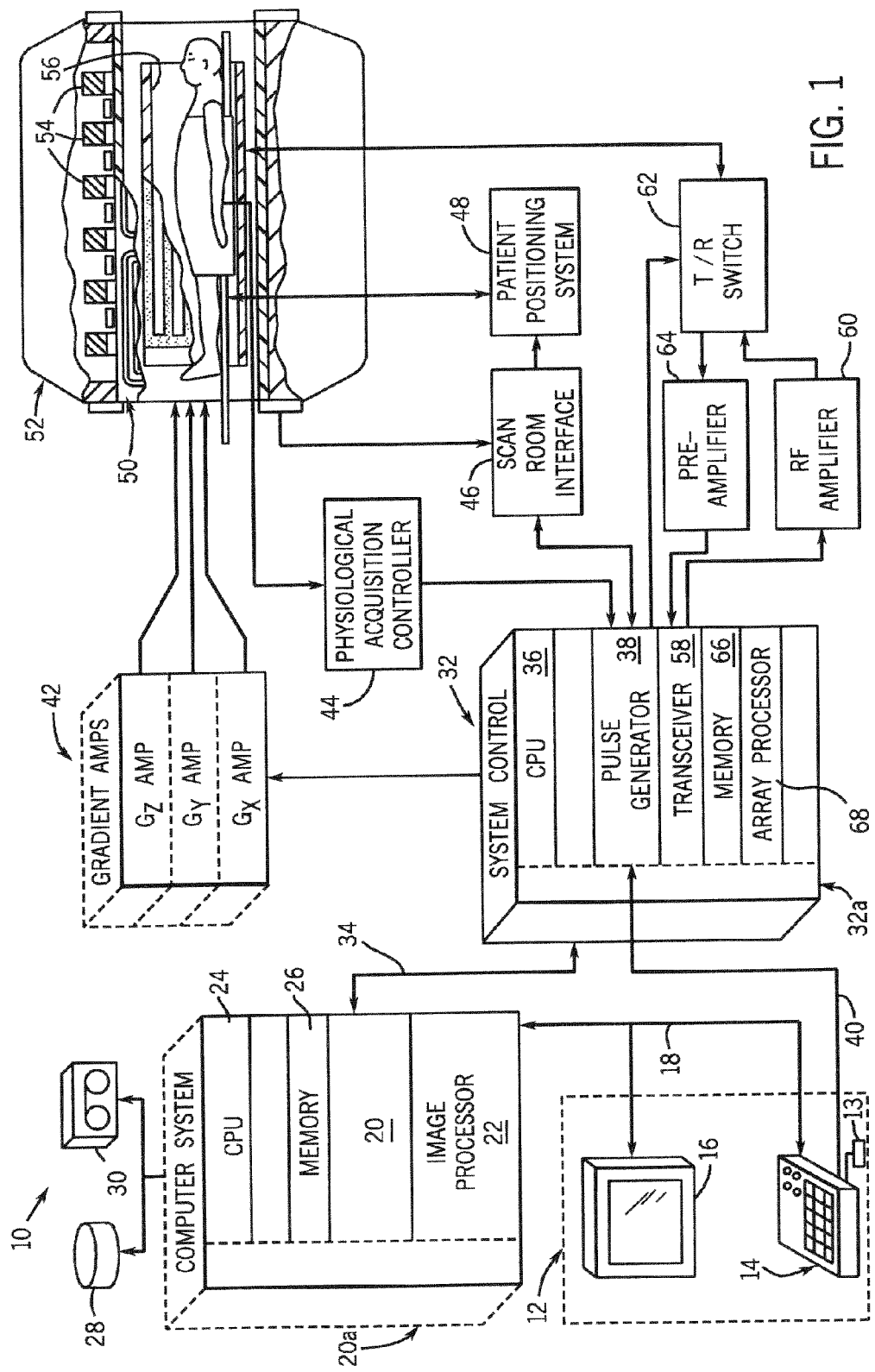
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a method of RF deposition prediction that can be carried out on the MR system of FIG. 1 or equivalents thereof. As will be described, the invention is effective in reducing the number of interrupted scans due to power monitor trips by improving an RF deposition prediction model based on an inaccurate patient assumption. In this regard, the present invention improves the accuracy of the scan prescription parameters to correctly model the patient and, as such, is an effective tool for clinical applications that reduces the number of repeat scans that are required of a patient and increases patient throughput.

The RF deposition prediction model used to guide prescription of a scan for a patient is updated by a correction factor. In this regard, the present invention provides real-time modification of the RF deposition prediction model to take patient SAR mass errors into account when prescribing scan parameters. Variations in patient morphology or landmark that may cause mis-predictions of patient-absorbed SAR during scan prescription are corrected to better estimate the patient-absorbed SAR for the selected RF deposition prediction model. In this manner, prescribed scan parameters for a scan in which there is an incorrect assumption of patient mass may be corrected to constrain the patient-absorbed SAR below recommended SAR levels during the scan, which reduces interruptions due to power monitor trips.

In conventional SAR prediction models, the assumed energy, JSTD, of a standard, 1 millisecond, 180° square pulse using in a patient with mass "m" is used and may be expressed as:

$$JSTD = c\alpha m^\beta, \quad \text{(Eqn. 1),}$$

where "α" and "β" are constants and "c" is the corrected JSTD for the particular patient and landmark. Assuming a pulse repetition time of TR, the associated SAR contribution averaged over the entire mass may be expressed as:

$$SAR = \frac{c\alpha m^{\beta-1}}{TR}. \quad \text{(Eqn. 2)}$$

Similarly, the peak power of the pulse may be expressed in terms of the pulse width, $\tau$, as:

$$P_{peak} = \frac{c\alpha m^{\beta}}{\tau}. \quad \text{(Eqn. 3)}$$

Next, assuming that the mass is incorrectly predicted by a factor of "f", the scan prescription will limit slices so the apparent specific absorption ratio, SAR', is:

$$SAR' = \frac{c\alpha(fm)^{\beta-1}}{TR} = SAR f^{\beta-1}. \quad \text{(Eqn. 4)}$$

The power monitor for 3T MRI systems estimates $SAR_{PM}$ by measuring the actual average power (=JSTD/TR) and dividing by the entered mass (=fm):

$$SAR_{PM} = \frac{c\alpha m^{\beta}}{(fm)TR} = \frac{c\alpha m^{\beta-1}}{fTR} = \frac{SAR}{f}. \quad \text{(Eqn. 5)}$$

From Equation 5, "f" may be found from the ratio of $SAR/SAR_{PM}$.

Equations 4 and 5 illustrate that combining scan prescription SAR predictions with power monitor measurements provides failsafe measures for scans including incorrect patient weight assumptions. Table 1 illustrates the effect of mass errors on SAR control.

TABLE 1

| Weight Factor Error | SAR' | $SAR_{PM}$ | Results |
|---|---|---|---|
| f > 1 | SAR' > SAR | $SAR_{PM}$ < SAR | Scan prescription limits SAR |
| f < 1 | SAR' < SAR | $SAR_{PM}$ > SAR | Power monitor limits SAR |

Table 1 shows that if "f">1, the power monitor does not trip, but scan prescription controls slices to reduce SAR. That is, slices are controlled based on the measured SAR. Preferably, SAR is reduced by reducing the number of slices in the scan. If "f"<1, the scan prescription accurately predicted patient mass, or, alternatively, over-estimated patient mass, and in one embodiment, the prescription model will not place additional constraints on prescribing a subsequent scan. In an alternative embodiment, the prescription model is updated to modify the scan prescription to consider an over-estimation of patient mass. In this manner, the prescription model controls slices to increase measured SAR. That is, it is contemplated that a user notification can be provided to inform the user that the given patient can handle a more RF powerful scan, i.e., increased number of slices, increased peak power, etc., than was initially predicted. As an additional precaution, the power monitor will trip if the SAR is excessive for the subsequent scans. That is, the default RF prediction model based on the patient weight assumptions does not need correction for incorrect patient weight assumptions. As shown in Table 1, a combination of scan prescription and power monitor measuring can limit excessive SAR to be absorbed by the patient during a scan.

Figure 2:
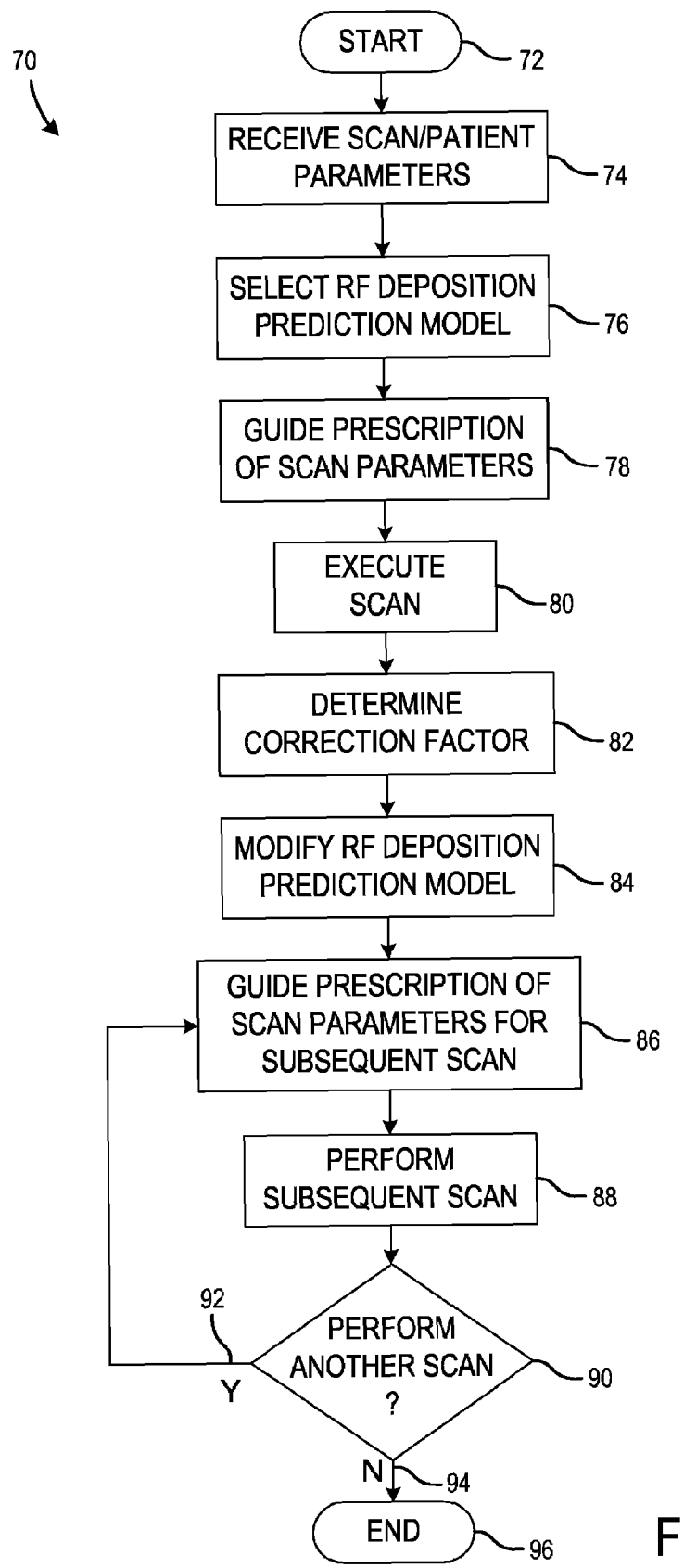
FIG. 2 is a flowchart setting forth the steps of updating an SAR prediction model according to the present invention.

Referring now to FIG. 2, the steps of an RF deposition model refinement technique 70 according to the present invention are set forth. The RF deposition model refinement technique 70 begins at 72 with receiving inputs of an impending scan. In this regard, inputs defining scan and patient parameters are received at 74. The scan and patient parameters are used to select an RF deposition prediction model at step 76 and estimate, for example, patient mass. The RF deposition, or SAR, prediction model is a predictive model used to guide scan parameter prescription of the impending scan at step 78. The scan parameter prescription includes calculating an RF parameter value measurable during the scan. In the preferred embodiment, the RF parameter value is the value of SAR to be absorbed by a patient. In an alternative embodiment, the RF parameter value is RF pulse peak power.

The technique 70 continues with execution of the scan at 80 to acquire MR data. During execution of the scan, the RF parameter is measured. In a preferred embodiment, the scan is a prescan or scout scan that keeps the actual SAR absorbed by the patient below SAR threshold limits. A correction factor is determined at step 82 that includes a ratio of the calculated RF parameter value to the measured RF parameter value as described below. Once the correction factor is determined, the RF deposition prediction model is modified at step 84 to take the correction factor into account and, thus, is updated to account for incorrect assumptions in RF characteristics of the patient, such as patient mass. The modified RF deposition prediction model guides scan parameter prescription to prescribe a subsequent scan wherein the differences between the predicted RF parameter value and the measured RF parameter value during the scan have been considered. The prescribed scan according to the modified RF deposition prediction model may include, but is not limited to, RF pulse stretching or variable rate selective excitation (VERSE) optimization. The modified RF deposition prediction model guides scan parameter prescription of a subsequent scan at step 86, and the subsequent scan is performed at 88. At step 90, the technique 70 allows for a decision to be made to perform another scan based on the modified RF deposition prediction model. If another scan is to be performed 92, then control passes to step 86, and technique 70 proceeds as described above. If no further scan is to be performed 94, then technique 70 ends at 96.

Table 2 shows results acquired from phantom and volunteer scans using uncorrected and corrected models.

TABLE 2

| | | | Uncorrected Model | | | Corrected Model | | | |
|---|---|---|---|---|---|---|---|---|---|
| Subject | Weight | Scan Type | Scan Time | SAR Predicted | SAR Measured | Scan Time | SAR Predicted | SAR Measured | Comments |
| Loaded Phantom | 111 | T1 FLAIR | 3:14 | 2.7 | 4.1 | 4:27 | 2.1 | 2.0 | TR reduced from 3000 to 2000 with correction and 2 Acqs |
| Subject #1 | 150 | T1 FLAIR | 3:14 | 2.4 | 3.1 | 4:11 | 2.9 | 2.8 | TR reduced from 3000 to 2350 with correction and 2 Acqs |
| Subject #1 | 150 | T2 FRFSE | 3:31 | 2.5 | 3.2 | 4:23 | 2.9 | 2.7 | ETL reduced from 24 to 20 with correction |
| Subject #2 | 160 | T1 FLAIR | 3:14 | 2.5 | 3.3 | 4:30 | 2.9 | 2.8 | TR reduced from 3000 to 2400 with correction and 2 Acqs |
| Subject #2 | 160 | T2 FRFSE | 3:31 | 2.6 | 3.5 | 4:45 | 2.9 | 2.7 | ETL reduced from 24 to 19 with correction |
| Subject #2 | 160 | T1 FSE | 2:12 | 2.5 | 2.8 | 2:40 | 2.87 | 2.6 | TR increased from 500 to 600 with correction |

As illustrated in Table 2, scans were performed on each subject that included an uncorrected RF prediction model and a corrected RF prediction model. As shown in the uncorrected RF prediction models, the predicted SAR is below the measured SAR. Incorrectly predicting the SAR in this manner leads to power monitor trips, which may interrupt scans when the SAR threshold is reached. In the corrected model of each subject, the predicted SAR is greater than the measured SAR. Thus, interruptions caused by power monitor tripping are reduced. As indicated in the Comments column, the corrected model for the T1 weighted scans included modifying TR. Also, as indicated, the corrected model for the T2 weighted scans included modifying the echo train length (ETL).

An RF deposition prediction model refinement technique according to the present invention uses real-time measurement to refine the RF deposition prediction model. As such, power monitor trips are reduced. Further, real-time refinement of the RF deposition prediction model may provide better scan time performance since the RF deposition prediction model can be less conservative.

Therefore, in accordance with one embodiment of the invention, the present invention includes a method of MR imaging that includes the steps of determining a radio frequency (RF) deposition prediction model for a scan and guiding prescription of the scan with the RF deposition prediction model. The method further includes the steps of measuring an RF parameter value during execution of the scan and determining a correction factor based on the measured RF parameter value. The method further includes the step of updating the RF deposition prediction model by the correction factor.

In accordance with another embodiment of the invention, an MR imaging apparatus has a plurality of gradient coils positioned about a bore of a magnet to impress a polarizing magnetic field and an RF transceiver system and an RF switch controlled by a pulse module to transmit RF signals to an RF coil assembly to acquire MR images. The apparatus further includes a computer readable storage medium having stored thereon a computer program comprising instructions which when executed by a computer cause the computer to establish a radio frequency (RF) deposition prediction model for a scan, the model setting sequence parameter limits for the scan. The computer is also programmed to guide prescription of the scan within the sequence parameter limits.

The computer is further programmed to predict a value for a measurable RF parameter based on the prescribed scan, perform the prescribed scan, and measure the measurable RF parameter during the scan to determine a measured value. The computer is also programmed to compare the predicted value to the measured value and update the RF deposition prediction model based on the comparison.

According to another embodiment, the invention is embodied in a computer program stored on a computer readable storage medium having instructions that when executed by a computer cause the computer to establish a specific absorption rate (SAR) prediction model for a scan and perform the scan to acquire MR data from a subject. The computer is also caused to measure at least one RF parameter level during the scan and update the SAR prediction model for a subsequent scan of the subject.

The present invention has been described in terms of the preferred embodiment, and it is recognized that equivalents, alternatives, and modifications, aside from those expressly stated, are possible and within the scope of the appending claims.

What is claimed is:

1. A method of MR imaging comprising the steps of:
    determining a radio frequency (RF) deposition prediction model for a scan;
    guiding prescription of the scan with the RF deposition prediction model;
    measuring an RF parameter value during execution of the scan;
    determining a correction factor based on the measured RF parameter value;
    updating the RF deposition prediction model by the correction factor; and
    reconstructing an image from imaging data acquired in a subsequent scan that is based on the updated RF deposition prediction model.

2. The method of claim 1 further comprising the step of calculating the RF parameter value prior to execution of the scan.

3. The method of claim 2 wherein the step of determining the correction factor further comprises determining the correction factor from a ratio between the calculated RF parameter value and the measured RF parameter value.

4. The method of claim 2 wherein the step of measuring the RF parameter value further comprises measuring a specific absorption rate and wherein the step of calculating the RF parameter value further comprises calculating the specific absorption rate.

5. The method of claim 2 wherein the step of measuring the RF parameter value further comprises measuring an RF peak power and wherein the step of calculating the RF parameter value further comprises calculating the RF peak power.

6. The method of claim 1 further comprising the step of guiding prescription of the subsequent scan using the updated RF deposition prediction model.

7. The method of claim 6 further comprising the step of prescribing a fewer number of scan slices in the subsequent scan than a number of scan slices in the scan.

8. The method of claim 6 further comprising the step of prescribing the subsequent scan based on one of RF pulse stretching and VERSE optimization.

9. The method of claim 1 further comprising the steps of receiving patient measurement data and determining the RF deposition prediction model therefrom.

10. The method of claim 9 wherein the step of receiving patient measurement data includes receiving a patient weight measurement.

11. The method of claim 1 further comprising the steps of measuring RF power deposited in a patient during the scan with a power monitor and interrupting the scan when the power monitor measures deposited RF power in the patient of at least a prescribed deposition limit.

12. A magnetic resonance (MR) imaging apparatus comprising:
 a plurality of gradient coils positioned about a bore of a magnet to impress a polarizing magnetic field and an RF transceiver system and an RF switch controlled by a pulse module to transmit RF signals to an RF coil assembly to acquire MR images; and
 a computer readable storage medium having stored thereon a computer program comprising instructions which when executed by a computer cause the computer to:
  establish a radio frequency (RF) deposition prediction model for a scan, the model setting sequence parameter limits for the scan;
  guide prescription of the scan within the sequence parameter limits;
  predict a value for a measurable RF parameter based on the prescribed scan;
  perform the prescribed scan;
  measure the measurable RF parameter during the scan to determine a measured value;
  compare the predicted value to the measured value; and
  update the RF deposition prediction model based on the comparison.

13. The apparatus of claim 12 having further instructions to cause the computer to guide prescription of another scan within sequence parameter limits set by the updated RF deposition prediction model.

14. The apparatus of claim 12 having further instructions to cause the computer to receive a plurality of patient measurement parameters including a patient weight parameter.

15. The apparatus of claim 12 further comprising a power monitor configured to measure a specific absorption rate (SAR) during the prescribed scan and having further instructions to cause the computer to halt the prescribed scan if the measured SAR reaches a threshold.

16. A computer readable storage medium having a computer program stored thereon and representing a set of instructions that when executed by a computer causes the computer to:
 establish a specific absorption rate (SAR) prediction model for a scan;
 perform the scan to acquire MR data from a subject;
 measure at least one RF parameter level during the scan;
 update the SAR prediction model for a subsequent scan of the subject
 perform the subsequent scan to acquire MR data from the subject; and
 reconstruct an image from the MR data acquired during the subsequent scan.

17. The computer readable storage medium of claim 16 having further instructions to cause the computer to guide prescription of the scan using a set of sequence parameter limits set by the SAR prediction model.

18. The computer program of claim 16 having further instructions to cause the computer to calculate at least one predicted RF parameter level prior to the scan.

19. The computer readable storage medium of claim 18 wherein the set of instructions causes the computer to update the SAR prediction model by a relationship between the calculated at least one predicted RF parameter level and the measured at least one RF parameter level.

20. The computer readable storage medium of claim 19 having further instructions to cause the computer to guide prescription of a subsequent scan using a set of sequence parameter limits set by the updated SAR prediction model.

21. The computer program of claim 16 wherein the set of instructions causes the computer to measure one of a specific absorption rate and an RF peak power.

* * * * *

UNITED STATES PATENT AND TRADEMARK OFFICE
CERTIFICATE OF CORRECTION

PATENT NO. : 7,355,404 B1
APPLICATION NO. : 11/275128
DATED : April 8, 2008
INVENTOR(S) : Hariharan et al.

It is certified that error appears in the above-identified patent and that said Letters Patent is hereby corrected as shown below:

On the title page,

Item [75], Column 1, "Inventors:" after "Hari Hariharan, Pewaukee, WI (US);" delete "Joseph D. Schaefer", and substitute therefore
"-- Daniel J. Schaefer --".

Signed and Sealed this

Twenty-second Day of July, 2008

JON W. DUDAS
*Director of the United States Patent and Trademark Office*